(12) United States Patent
Nagasawa et al.

(10) Patent No.: US 6,623,219 B2
(45) Date of Patent: Sep. 23, 2003

(54) PRINTED BOARD PROCESSING MACHINE

(75) Inventors: Katsuhiro Nagasawa, Ebina (JP); Tamio Otani, Ebina (JP); Akira Irie, Ebina (JP)

(73) Assignee: Hitachi Via Mechanics, Ltd. (JP)

( * ) Notice: Subject to any disclaimer, the term of this patent is extended or adjusted under 35 U.S.C. 154(b) by 166 days.

(21) Appl. No.: 09/758,877

(22) Filed: Jan. 11, 2001

(65) Prior Publication Data
US 2001/0019686 A1 Sep. 6, 2001

(51) Int. Cl.[7] .................................................. B23Q 5/02
(52) U.S. Cl. ........................... 408/43; 409/212; 33/1 M
(58) Field of Search ...................... 33/1 M, 503, 613, 33/645, 549, 555, 573; 408/42, 43, 44, 46, 50; 409/202, 212

(56) References Cited

U.S. PATENT DOCUMENTS

| | | | |
|---|---|---|---|
| 5,230,685 A | * | 7/1993 | Christen et al. |
| 5,265,986 A | * | 11/1993 | Prokopp |
| 5,584,788 A | * | 12/1996 | Piovano |
| 5,882,286 A | * | 3/1999 | Aufiero |
| 6,231,279 B1 | * | 5/2001 | Aufiero |
| 6,325,576 B1 | * | 12/2001 | Kosmowski |

FOREIGN PATENT DOCUMENTS

JP 64-58405 * 3/1989

* cited by examiner

*Primary Examiner*—William M. Pierce
(74) *Attorney, Agent, or Firm*—Richard P. Gilly, Esquire; Wolf, Block, Schorr and Solis-Cohen, LLP

(57) ABSTRACT

Nuts 22, 23 are engaged with one ball screw 10, and the nut 22 is directly fixed on a slider main body 7s. The nut 23 is rotatably held by a bearing 25, and a bearing holder 24 holding the bearing 25 is fixed on a slider main body 7t. And, a gear 26 is fixed on the side of the nut 23, and a gear 29 engaging with the gear 26 is provided. And, a motor 28 for driving a gear 29 is fixed on a bracket 27, being united with the slider main body 7t. The ball screw 10 is stopped and the motor 28 is rotated so as to individually position the slider 7b. Even if the number of the sliders is increased, a machine is not made bigger, and the printed board processing machine having simple structure can be provided.

9 Claims, 4 Drawing Sheets

F I G. 1
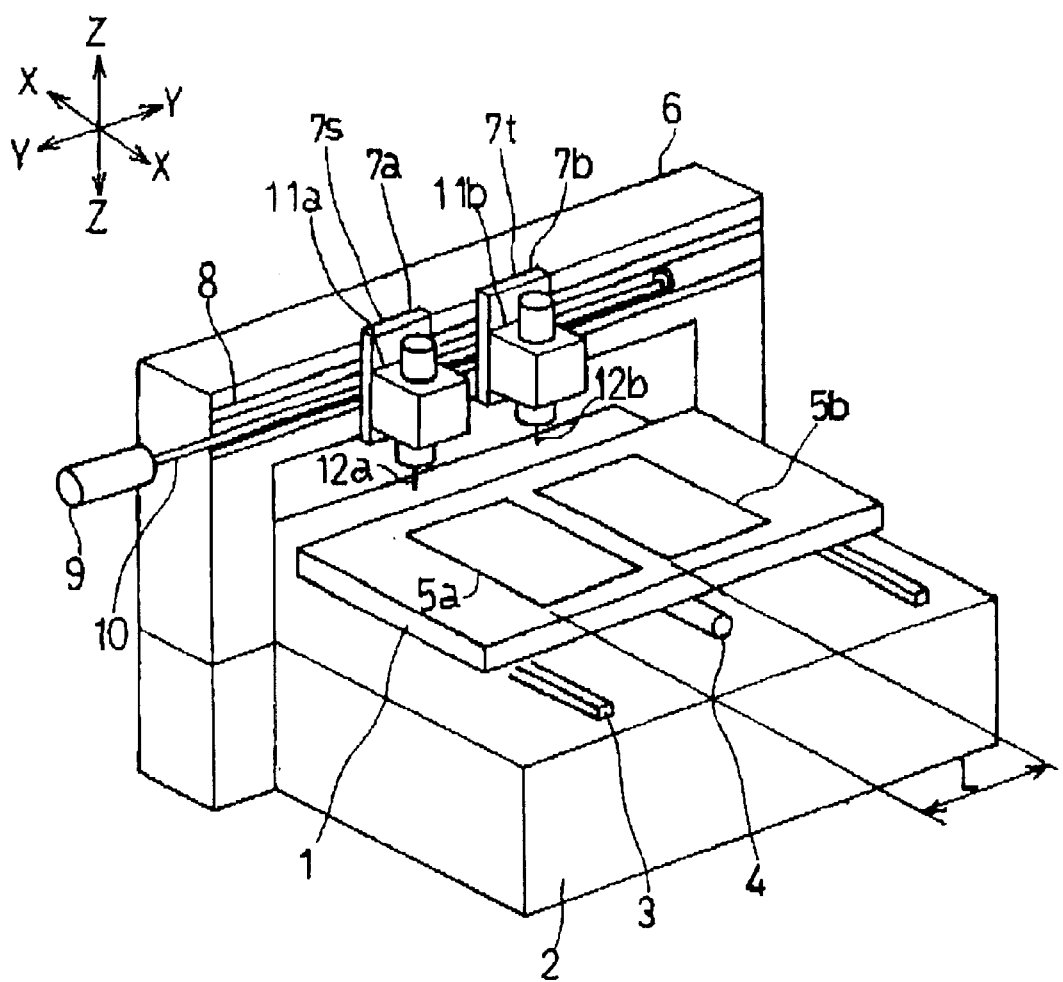

PRINTED BOARD PROCESSING MACHINE

FIELD OF THE INVENTION

This invention relates to a printed board processing machine having a plurality of spindles capable of relatively driving in a three-dimensional direction with respect to a table.

DESCRIPTION OF THE PRIOR ART

A Japanese patent application (publication number S64-58405) discloses a printed board boring machine wherein orthogonal three axes comprised of vertical axis Z and horizontal axes X, Y are set, having a horizontal table to be reciprocated and driven in the X-axis direction, sliders to be reciprocated and driven in the Y-axis direction and a plurality of spindles in the Z-axis direction located on the sliders. In this printed board boring machine, the number of the sliders is plural number, the spindle is located on each of a plurality of sliders, the means for individually guiding a plurality of sliders in the Y-axis direction and the means for individually reciprocating and driving in the Y-axis direction are provided. According to this art, the distance between the axes of a plurality of spindles can be adjusted to an optional size by individually positioning the sliders.

But, the ball screws of the same number as the sliders are necessary in order to individually reciprocate and drive the respective sliders even if the guide means of a plurality of sliders is common use in case of the above-mentioned prior art. For this reason, the machine is made bigger and the structure is made complex if the number of the sliders is increased.

The object of the present invention is to provide the printed board processing machine whereby the problems in the above-mentioned prior art can be resolved, the machine is not made bigger and the structure is simple even if the number of the sliders is increased.

SUMMARY OF THE INVENTION

The invention of claim 1 for achieving the above-mentioned objects is printed board processing machine having a plurality of sliders each supporting a spindle capable of installing a tool, guide means for movably guiding said each slider in a predetermined direction, a screw axis free to rotate, drive and stop, and a table capable of locating a workpiece thereon, whereby a plurality of said sliders is moved and driven in said predetermined direction by rotating and driving said screw axis, and said each spindle and said table are relatively moved and driven in a direction intersecting with said direction of moving said slider so as to machine on a workpiece by said tool installed on said each spindle; said printed board processing machine comprising:

said each slider having a nut engaged with the same screw axis and a slider main body engaging with said guide means and supporting said spindle; and at least said one slider having nut holding means between said slider main body and said nut, for rotatably holding said nut with respect to said slider main body, and rotating and driving means free to rotate, drive and stop said nut with respect to said slider main body.

The invention of claim 2 is that in one slider of a plurality of said sliders, said slider main body and said nut are fixedly connected with each other.

The invention of claim 3 is that a nut rotation restricting means being free to restrict rotation of said nut with respect to said slider main body is provided.

The invention of claim 4 is that said rotating and driving means is comprised of a driving motor and power transmitting means provided between said driving motor and said nut, and said driving motor is provided with said slider main body.

The invention of claim 5 is that said nut holding means is a bearing means provided between said slider main body and said nut.

The invention of claim 6 is that a screw axis driving motor for rotating and driving said screw axis is provided, and a control means for controlling so as to rotate and drive said screw axis driving motor only in case of restricting the rotation of said nut by driving said nut rotation restricting means is provided in the invention of claim 3.

The invention of claim 7 is that a screw axis rotation restricting means capable of restricting the rotation of said screw axis is provided.

The invention of claim 8 is that a control means for controlling so as to rotate and drive said rotating and driving means only in case of restricting the rotation of said screw axis by driving said screw axis rotation restricting means is provided in the invention of claim 7.

The invention of claim 9 is that two of said sliders are provided with said screw axis, and said rotating and driving means is located so as to position outside in a direction moving and driving said these sliders.

When the nut is rotated and driven by the rotating and driving means in each slider in the state of stopping the screw axis with the above-mentioned structure, the slider having the nut is moved and driven along the screw axis. When the screw axis is rotated and driven in the state of stopping the rotating and driving means in each slider, a plurality of sliders is simultaneously moved and driven.

According to the present invention, the structure of individually positioning a plurality of sliders can be realized with only one screw axis. Then, the machine is not made bigger, and its structure can be made simple even if the number of sliders is increased.

BRIEF DESCRIPTION OF THE DRAWINGS

FIG. 1 is an external appearance view of printed board processing machine according to the present invention;

DESCRIPTION OF THE PREFERRED EMBODIMENTS

Figure 2:
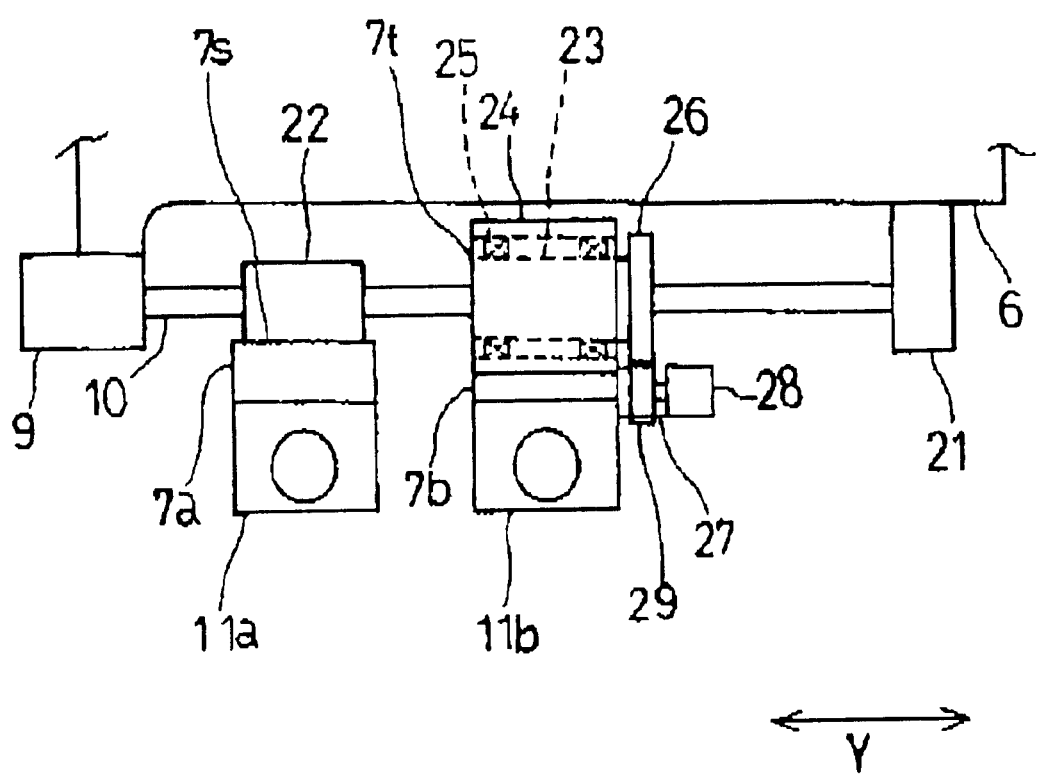
FIG. 2 is a top view showing important portions of the printed board processing machine according to the present invention.

The embodiment of the present invention will now be explained hereinafter, referring to drawings. FIG. 1 is an external appearance view of printed board processing machine according to the present invention.

A table 1 is movable in X-axis direction by a pair of linear guides 3 which are fixed on a bed 2, and is driven by a motor 4. Two sheets of printed boards 5a, 5b, which machining contents are the same as each other, are located and fixed on the table 1. The machining standard positions of both printed boards 5a, 5b are the same as each other in X coordinates and are apart L from each other in Y-axis direction. A column 6 is fixed by the bed 2, and is united with the bed 2. Sliders 7a, 7b engage with a pair of linear guides 8 which are fixed on the column 6, and are movable in the Y-axis direction thereby. A motor 9 drives the sliders 7a, 7b through a ball screw 10, as mentioned hereinafter. The sliders 7a, 7b respectively support housings 11a, 11b so as to be free to move and drive in Z-axis direction, which is the up and down direction. Numerals 12a, 12b show tools, such as a drill, and the tools 12a, 12b are respectively installed and held by a spindle (not shown) supported by the housings 11a, 11b so as to be free to rotate.

Figure 3:
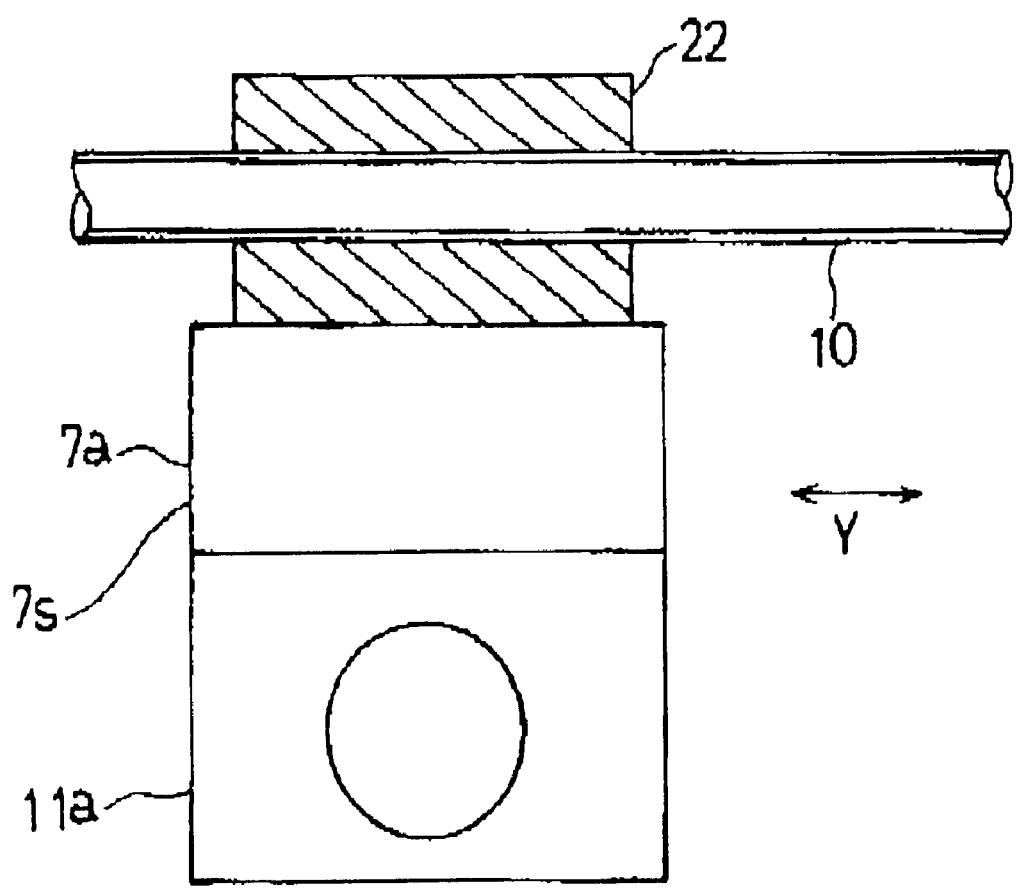
FIG. 3 is an enlarged sectional view of the engagement portion between one slider and a ball screw of the present invention.
Figure 4:
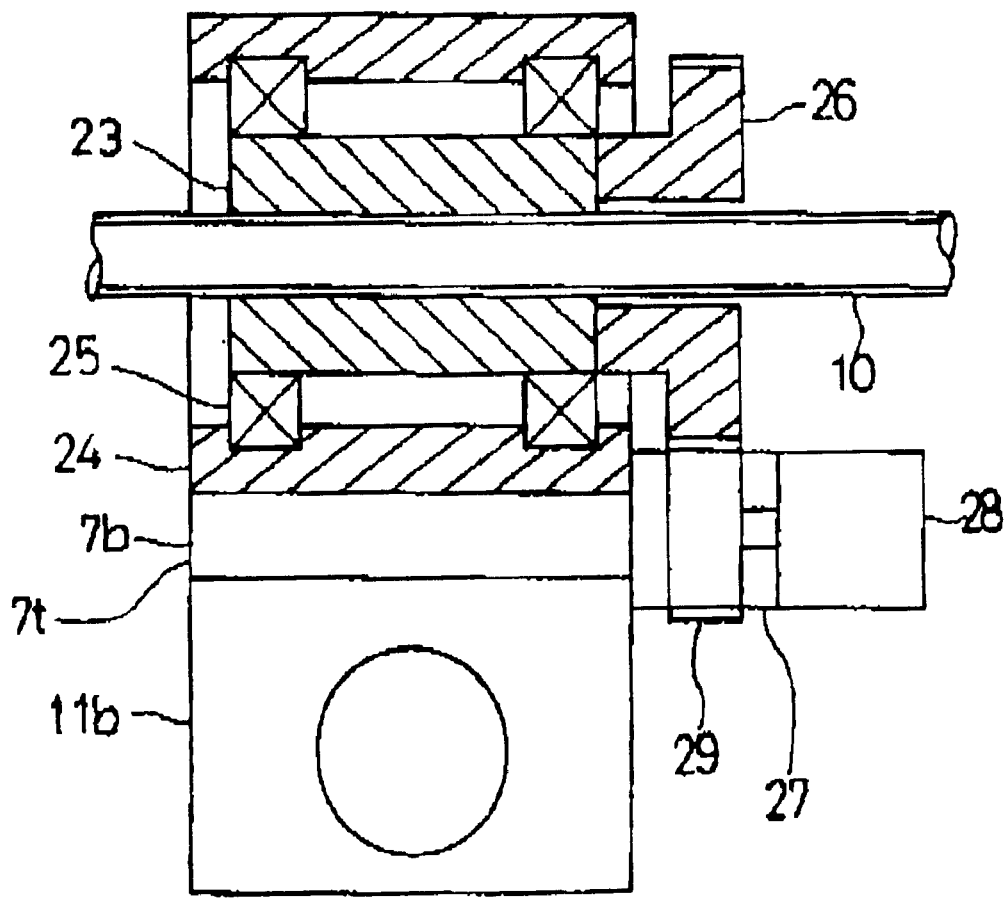
FIG. 4 is an enlarged sectional view of the engagement portion between the other slider and the ball screw of the present invention.

Subsequently, the driving portions of the sliders 7a, 7b will now be explained, referring to FIGS. 2 through 4. FIG. 2 is the top view showing important portions of the printed board processing machine according to the present invention. FIG. 3 is an enlarged sectional view of the portion which the slider 7a engages with the ball screw 10. FIG. 4 is an enlarged sectional view of the portion which the slider 7b engages with the ball screw 10.

The motor 9 is fixed on the column 6, and the ball screw 10 is free to rotate, drive and stop by the motor 9. One end of the ball screw 10 is connected with an output shaft of the motor 9, and the other end is rotatably supported by a bracket 21 fixed on the column 6. A nut on a standard side ("standard nut 22" hereinafter) and a nut on a position adjustment side ("adjustable nut 23" hereinafter) engage with the ball screw 10.

The slider 7a is comprised of a slider main body 7s engaging with the linear guide 8 and supporting the above-mentioned spindle (not shown), and the standard nut 22 fixed on and connected with the slider main body 7s. And, the slider 7b has a slider main body 7t engaging with the linear guide 8 and supporting the above-mentioned spindle (not shown), and the adjustable nut 23. The outer periphery of the adjustable nut 23 is rotatably held by a bearing holder 24 fixed on the slider main body 7t through a pair of bearings 25. A gear 26 is fixed on one side of the adjustable nut 23, coaxial with the axial center of the adjustable nut 23. The adjustable nut 23, a pair of bearings 25 and the bearing holder 24 are coaxially assembled so as to be equal to or smaller than the width of the slider main body 7t in the Y-axis direction, that is, the width of the direction in which the slider 7b moves.

A motor 28, having a braking function capable of stopping the rotation of the output shaft, is fixed on a bracket 27 fixed on the side of the slider main body 7t opposite to the other slider 7a, and a gear 29 engaging with the gear 26 is fixed on the output shaft of the motor 28.

Subsequently, the motions in the present embodiment will now be explained. At first, the braking of the motor 28 is acted through an appropriate control means, the adjustable nut 23 is restricted in its rotation with respect to the slider main body 7t thereby. When the motor 9 is rotated through the control means so as to rotate the ball screw 10 in such a state, the standard nut 22 and the adjustable nut 23, that is, the sliders 7a and 7b move in the Y-axis direction according to the rotational angle of the ball screw 10. By doing so, the axial center of the drill 12a of the slider 7a is positioned on the standard position of the printed board 5a, the motor 9 is stopped, and the ball screw 10 is restricted and held at the position by an appropriate braking means (not shown) through the control means.

When the braking of the motor 28 is released through the control means so as to rotate in the above-mentioned state, the adjustable nut 23 rotates through the gears 29, 26. The slider 7b moves in the Y-axis direction according to the rotational angle of the adjustable nut 23 since the rotation of the ball screw 10 is stopped and held as mentioned before. By doing so, the axial center of the drill 12b is positioned on the standard position of the printed board 5b, the motor 28 is stopped and held so as to act the braking.

On this occasion, the motor 28 and the gears 26, 29 are located outside in the direction as shown by the arrow Y, that is, the direction in which both sliders 7a, 7b engaging with the ball screw 10 move and drive. Therefore, the motor 28 does not interfere with the slider 7a even if the sliders 7a and 7b approach each other. The interval of locating the printed boards 5a, 5b can be made narrower thereby, the machine can be made smaller.

Then, the setting of the interval between the drills 12a and 12b, that is, the setting of the distance L between both axes of the spindles finishes. In a similar way to the conventional way, the motor 4 and the motor 9 are driven so as to simultaneously position the drills 12a, 12b at the boring positions of the printed boards 5a, 5b in the X and Y directions, and the drills 12a, 12b are simultaneously moved in the Z-axis direction so as to bore the printed boards 5a, 5b.

In the present embodiment, its structure is that the slider 7b can be positioned at an optional position with the slider 7a as its standard. Then, the distance between the drill 12a and the drill 12b, that is, the distance between the axes of the spindles can be easily adjusted, and various sized printed boards can be machined.

Besides, the motor 28 is used only at the time of positioning of the slider 7b. Then, the capacity of the motor can be made smaller and the machine is not made bigger.

Furthermore, the above-mentioned embodiment refers to the case of the machine having two sliders. But, the present invention can be applied to the machine having three or more sliders also. In this case, if the number of sliders is N, for one slider of these, the standard nut 22 is provided similar to the slider 7a, and for each of the remaining (N−1) sliders, the adjustable nut 23, the holding means of the adjustable nut 23 (that is, the bearing holder 24 and a pair of the bearings 25) and the rotating and driving means of the adjustable nut 23 (that is, the gears 26, 29 and the motor 28) are provided similar to the slider 7b. By doing so, the respective sliders can be individually positioned.

In the above-mentioned embodiment, the standard nut 22 is directly fixed on the slider 7a. But, in an another structure, the adjustable nut 23 and its holding means and rotating and driving means may be provided with the slider 7a side, similar to the structure of the slider 7b side.

Furthermore, the present invention can be applied to an outside processing machine of a printed board also, in addition to the printed board boring machine.

The present invention is explained on the basis of the embodiment heretofore. The embodiments which are described in the present specification are illustrative and not limiting. The scope of the invention is designated by the accompanying claims and is not restricted by the descriptions of the specific embodiments. Accordingly, all the transformations and changes belonging to the claims are included in the scope of the present invention.

What is claimed is:

1. A printed board processing machine comprising:
   a plurality of sliders each supporting a spindle capable of installing a tool thereon;
   a guide means for movably guiding said each slider in a predetermined direction;
   a single feed screw being rotatably supported by a column;

a table capable of locating a workpiece thereon;

a single feed screw rotating driving means for rotating driving and stopping said feed screw, provided at said feed screw;

said each slider having (a) a slider main body engaging with said guide means and supporting said spindle and (b) a nut provided at said slider main body and fitted on said single feed screw; and at least said one slider having nut holding means between said slider main body and said nut for rotatably holding said nut with respect to said slider main body, and nut rotating driving means free to rotate for driving and stopping said nut with respect to said slider main body, wherein said printed board processing machine can machine said workpieces with said tool installed on each said spindle by rotating and driving said single feed screw by said single feed screw rotating driving means so as to synchronously move and drive a plurality of said sliders in said predetermined direction and by moving and driving said each spindle and said table in a direction intersecting with said predetermined direction.

2. The printed board processing machine as set forth in claim 1 wherein in one slider of a plurality of said sliders, said slider main body and said nut are fixedly connected with each other.

3. The printed board processing machine as set forth in claim 1 wherein a nut rotation restricting means being free to restrict rotation of said nut with respect to said slider main body is provided.

4. The printed board processing machine as set forth in claim 1, wherein said nut rotating driving means is comprised of a driving motor and power transmitting means provided between said driving motor and said nut, and said driving motor is provided at said slider main body.

5. The printed board processing machine as set forth in claim 1 wherein said nut holding means is a bearing means provided between said slider main body and said nut.

6. The printed board processing machine as set forth in claim 3, wherein said feed screw rotating driving means is a screw axis driving motor, and a first control means for controlling so as to rotate and drive said screw axis driving motor only in case of restricting the rotation of said nut by driving said nut rotation restricting means is provided.

7. The printed board processing machine as set forth in claim 1, wherein a feed screw rotation restricting means for restricting the rotation of said feed screw is provided.

8. The printed board processing machine as set forth in claim 7, wherein a second control means for controlling so as to rotate and drive said nut rotating driving means only in case of restricting the rotation of said feed screw by driving said feed screw rotation restricting means is provided.

9. The printed board processing machine as set forth in claim 1, wherein two of said sliders are provided with said feed screw, and said nut rotating driving means is located so as to position outside of said sliders in a direction moving and driving said these sliders.

* * * * *